United States Patent [19]

Barton et al.

[11] Patent Number: 5,026,626

[45] Date of Patent: Jun. 25, 1991

[54] OXYGEN RESISTANT RADIATION-POLYMERIZABLE COMPOSITION AND ELEMENT CONTAINING A PHOTOPOLYMER COMPOSITION

[76] Inventors: Oliver A. Barton, 49 Afton Dr., Florham Park, N.J. 07932; James D. Wright, 411A R.D. #5, Flemington, N.J. 08822

[21] Appl. No.: 538,180

[22] Filed: Jun. 14, 1990

Related U.S. Application Data

[60] Division of Ser. No. 376,150, Jul. 5, 1989, Pat. No. 4,952,432, which is a continuation of Ser. No. 80,947, Aug. 3, 1987, abandoned.

[51] Int. Cl.$^5$ .............................................. G03C 1/725
[52] U.S. Cl. .................................... 430/288; 430/271; 430/272; 430/275; 430/281; 430/918; 522/106; 522/110
[58] Field of Search ............... 430/271, 272, 275, 281, 430/288, 296, 918; 522/106, 110

[56] References Cited

U.S. PATENT DOCUMENTS

| | | |
|---|---|---|
| 4,259,432 | 3/1981 | Kondoh et al. . |
| 4,264,705 | 4/1981 | Allen . |
| 4,288,527 | 9/1981 | Morgan . |
| 4,298,679 | 11/1981 | Shinozaki et al. . |
| 4,361,640 | 11/1982 | Pine . |
| 4,522,913 | 6/1985 | Kanno et al. . |
| 4,536,468 | 8/1985 | Yasui et al. . |
| 4,572,888 | 2/1986 | Maeda et al. . |
| 4,587,201 | 5/1986 | Morikawa et al. . |
| 4,705,740 | 11/1987 | Geissler et al. . |

OTHER PUBLICATIONS

English Language Abstract of Japanese Kokai JP 758158 7/22/76.
English Language Abstract of German Offen. 2422378 11/6/76.
English Language Abstract of German Offen. 2307923 10/11/73.
Chemical Abstracts Registry No. 25067-24-7.

*Primary Examiner*—Jack P. Brammer

[57] ABSTRACT

A photopolymeriziable composition which comprises poly butane diol diacrylate, a photoinitiator and a binding resin. Upon coating the composition onto a substrate a photographic element is formed which does not require the presence of an oxygen barrier layer.

23 Claims, No Drawings

OXYGEN RESISTANT RADIATION-POLYMERIZABLE COMPOSITION AND ELEMENT CONTAINING A PHOTOPOLYMER COMPOSITION

BACKGROUND OF THE INVENTION

The present invention relates to a radiation-polymerizable composition. More particularly, this invention relates to a radiation-polymerizable composition which may be employed to produce an improved photographic element such as a lithographic printing plate, or color proofing film or photoresist, especially dry film photoresists.

The use of radiation-polymerizable coatings in the graphic arts is well known. Typically, the composition of such coatings can include a polymeric constituent, which may itself be radiation-polymerizable, and a photosensitizer composition. Upon selected exposure of this coating to imaging energies, the radiation-polymerizable species within the composition would either itself undergo a reaction or promote a reaction or degradation of one or more of the other components of the composition. It is, of course, readily appreciated that such reaction is only of value in such a system where it is essentially confined, or limited, to those areas of the composition impinged upon by such imaging energies. A negative working image thus created within the coating can then be "developed" by selective removal of the non-exposed components of the film or layer which have not been subjected to imaging energies. The ability to create such selective changes in coatings prepared from a radiation-polymerizable composition has been appreciated for some time. The basic difference in the various approaches in the formulation of lithographic printing plates from radiation-polymerizable compositions has been in the search for a system which is prepared from relatively inexpensive ingredients, does not require prolonged imaging energies (has a high quantum efficiency), is able to undergo an increased number of press runs and results in the creation of high resolution images within the composition which can be manifested without prolonged and elaborate development and, significantly, may be developed with a composition which does not necessarily contain organic solvents and which need contain only a minor amount of salts and surfactants.

Most such lithographic printing plates comprise a metal substrate which is coated with a light sensitive diazonium compound in admixture with suitable binding resins, photoinitiators, photopolymerizable compositions, colorants, stabilizers, exposure indicators, surfactants and the like. On the other hand, color proofing films are frequently comprised of the foregoing compositions disposed on a transparent substrate such as polyethylene terephthalate.

Photographic processes are known which use photopolymers. There are various types of photographic color proofing methods; for example, the surprint type and the overlay type. In the overlay type of color proofing method, an independent transparent plastic support is used for producing a print of each color separation film by applying a photosensitive solution of the corresponding color, and a plurality of such supports carrying prints of corresponding colors are then superposed upon each other on a white sheet to produce a color proofing sheet. The overlay type of color proofing method has the disadvantage that the superposed plastic supports tend to darken the color proofing sheet and, as a result, the impression of the color proofing sheet thus prepared becomes vastly different from copies actually obtained by a conventional printing press or a proof press. Its primary advantage is that it is quick and can serve as a progressive proof by combining any two or three colors in register.

In the surprint type of color proofing method, a color proofing sheet is prepared by successively producing prints of different colors from different color separation films, respectively, by utilizing a single opaque support by applying toners, or by applying photosensitive solutions or coatings of photopolymers of corresponding colors on the opaque support in succession. Examples of some of these approaches are: U.S. Pat. No. 3,671,236 and U.S. Pat. No. 3,136,637. An advantage of the surprint type of color proof is that the color saturation is not influenced by the plastic support. This method more closely resembles the actual printing process and eliminates the color distortion inherent in the overlay system. Various processes for producing copies of an image embodying a photopolymerization and thermal transfer techniques are known. See U.S. Pat. Nos. 3,060,023, 3,060,024, 3,060,025, 3,481,736 and 3,607,264. In these processes, a photopolymerizable layer coated on a suitable support is exposed, imagewise, to a process transparency. The surface of the exposed layer is then pressed into contact with the image receptive surface of a separate element and at least one of the said elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter adheres, preferentially, to the clear unpolymerized material. The lamination, exposure and development steps are carried out for the respective colors, in sequence, thus making these processes time consuming.

Photopolymerizable imaging systems typically comprise an unsaturated monomer, a free-radical initiator which is activated by active radiation, and binder resins, colorants and the other optional additives as hereinbefore mentioned.

In the production of free-radical initiated photopolymerizable coatings, it is widely recognized that such reactions are subject to a quenching phenomenum by triplet oxygen of the free-radicals formed by irradiating the initiator. The premature return of the free-radicals to the energy ground state precludes the required energy transfer necessary to effect the polymerization reaction.

An art recognized method useful in preventing triplet oxygen quenching of radiation formed free-radicals is overcoating the base coating with a watersoluble polymeric resin. Such resins must be transparent, film-forming polymers which substantially act as oxygen barrier layers and which are inert and incompatible with all ingredients comprising the base coating.

The present invention improves upon the foregoing class of compositions by providing a photopolymerizable composition which does not require such an oxygen barrier. The composition employs a polymerizable monomer which is poly butane diol diacrylate in admixture with a polymerization initiator.

SUMMARY OF THE INVENTION

The invention provides a radiation polymerizable composition which comprises in admixture:
a. a polymerizable component which is poly butane diol diacrylate; and
b. a photoinitiator; and
c. a binding resin
wherein said binding resin is present in sufficient amount to bind the composition components in a uniform admixture; and wherein said photoinitiator is present in sufficient amount to induce a free-radical polymerization of the polymerizable component upon exposure to sufficient radiant or particle beam energy; and wherein said polymerizable component is present in sufficient amount to cause image differentiation upon coating the composition onto a substrate and applying thereto a sufficient amount of said exposing energy in an imagewise pattern.

The invention also provides:
A method for producing a photographic image which comprises
i) applying a radiation polymerizable composition to a substrate, which composition comprises
a. a polymerizable component which is poly butane diol diacrylate; and
b. a photoinitiator; and
c. a binding resin
wherein said binding resin is present in sufficient amount to bind the composition components in a uniform admixture; and wherein said photoinitiator is present in sufficient amount to induce a free-radical polymerization of the polymerizable component upon exposure to sufficient radiant or particle beam energy; and wherein said polymerizable component is present in sufficient amount to cause image differentiation upon coating the composition onto a substrate and applying thereto a sufficient amount of said exposing energy in an imagewise pattern; and
ii) imagewise exposing said composition to sufficient radiant or particle beam energy to cause imagewise polymerization; and
iii) removing the non-image areas of said composition with a developer.

DETAILED DESCRIPTION OF THE PREFERRED EMBODIMENT

In the preparation of the polymerizable composition one employs the aforesaid poly butane diol diacrylate as the polymerizable component. In the preferred embodiment it has a molecular weight in the range of from about 700 to 800. One particularly preferred oligomer is Al.co.cure PBDDA having a molecular weight of 774. It is available commercially from Alcolac of Baltimore, Md.

In the practice of the present invention the photopolymerizable poly butane diol diacrylate component is preferably present in the photosensitive layer in an amount ranging from about 18% to about 40.0% based on the weight of the solids in the layer. A more preferred range is from about 20.0% to about 38.0% and more preferably from about 22% to about 37.0%.

Free-radical liberating photoinitiators include any compound which liberates free-radicals on stimulation by actinic radiation. Preferred photoinitiators non-exclusively include p-methoxy phenyl quinoxalin, 9-phenyl acridine, the vicinal poly ketaldonyl compounds described in U.S. Pat. No. 2,367,660; the alpha-carbonyls described in U.S. Pat. No. 2,367,661 and 2,367,670; the acyloin ethers described in U.S. Pat. No. 2,448,828, the triarylimidazolyl dimer/p-amino-phenyl ketone combination described in U.S. Pat. No. 3,549,367 and the dye sensitized photolyzable organic halogen compounds described in U.S. Pat. Nos. 3,640,717 and 3,617,288.

In the practice of the present invention the photoinitiator component is preferably present in the photosensitive layer in an amount ranging from about 2.0% to about 10.0% based on the weight of the solids in the layer. A more preferred range is from about 3.0% to about 8.0% and more preferably from about 3.5% to about 7.0%.

The photosensitive composition also contains a binder which not only determines the hardness and/or flexibility of the coating but is also used to control developability of the image. For example, if the binder is too soluble in the developer used and too little polymerizable monomer is present, the image will wash off. At the other extreme if there is too little binder and too much polymerizable monomer the layer will be soft and fluid before exposure or the exposed image areas may be too hard for efficient transfer.

Binders found suitable for this use are styrene/maleic anhydride polymers that can vary in monomer content at a ratio of from about 70/30 to about 95/5; polymethyl methacrylate/methacrylic acid copolymer having a ratio of monomers ranging from about 70/30 to 95/5; polymethyl methacrylate/ethyl acrylate/methacrylic acid copolymer having a ratio of monomers ranging from about 50/30/20 to about 90/5/5., polymethyl methacrylate/butyl acrylate/ methacrylic acid copolymer having a ratio of monomers ranging from about 50/30/20 to about 90/5/5. Binders with no acid value but with the solubility characteristics to develop properly in the alkaline aqueous developers useful for the invention. Examples of this type of binder system non-exclusively include polyvinyl pyrolidone polymers K-60 and −90 (G.A.F.), hydroxypropyl cellulose, methyl cellulose and ethyl hydroxy ethyl cellulose polymers.

One preferred binding resin has the general formula

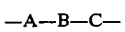

wherein a plurality of each of components A, B and C occur in ordered or random sequence in the resin and wherein A is present in said resin at about 5% to about 20% by weight and comprises groups of the formula

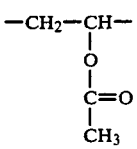

B is present in said resin at about 4% to about 30% by weight and comprises groups of the formula

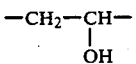

and C is present in said resin at about 50% to about 91% by weight and comprises acetal groups consisting of groups of the formulae

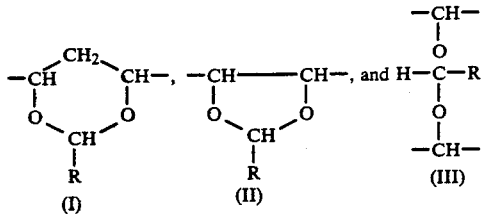

where R is lower alkyl or hydrogen, and wherein said group I is present in component C from about 75% to about 85%, group II is present in component C from about 3% to about 5%, and group III is present in component C from about 10% to about 22%, wherein said groups I, II and III are based on the number of acetal groups in component C. This composition is more fully described in U.S. Pat. No. 4,670,507 which is incorporated herein by reference.

In the practice of the present invention the binder component is preferably present in the photosensitive layer in an amount ranging from about 18.0% to about 40.0% based on the weight of the solids in the layer. A more preferred range is from about 20.0% to about 38.0% and most preferably from about 22.0% to about 33.0%. Other components which may be included in the radiation-polymerizable composition of this invention include acid stabilizers, exposure indicators, plasticizers, photoactivators and colorants.

Suitable acid stabilizers useful within the context of this invention include phosphoric, citric, benzoic, m-nitro benzoic, p(p-anilino phenylazo) benzene sulfonic acid, 4,4'-dinitro-2,2'-stilbene disulfonic, itaconic, tartaric and p-toluene sulfonic acid and mixtures thereof. Preferably, the acid stabilizer is phosphoric acid. When used, the acid stabilizer is preferably present in the radiation-polymerizable composition in the amount of from about 0.3% to about 2.0%, and most preferably from about 7.5% to about 1.5%, although the skilled artisan may use more or less as desired. Exposure indicators (or photoimagers) which may be useful in conjunction with the present invention include 4-phenylazodiphenylamine, eosin, azobenzene, Calcozine Fuchine dyes and Crystal Violet and Methylene Blue dyes. Preferably, the exposure indicator is 4-phenylazodiphenylamine. The exposure indicator, when one is used, is preferably present in the composition in an amount of from about 0.001% to about 0.0035% by weight. A more preferred range is from about 0.002% to about 0.030% and, most preferably, the exposure indicator is present in an amount of from about 0.005% to about 0.20%, although the skilled artisan may use more or less as desired.

The photoactivator which may be included in the composition of this invention should be an amine-containing photoactivator which combines synergistically with the free-radical photoinitiator in order to extend the effective half-life of the photoinitiator, which is normally in the approximate range of about $10^{-9}$ to $10^{-15}$ seconds. Suitable photoactivators include 2-(N-butoxy) ethyl-4-dimethylamino benzoate, 2-(dimethylamino) amino benzoate and acrylated amines. Preferably the photoactivator is ethyl-4-dimethylamino benzoate. The photoactivator is preferably present in the composition of this invention in an amount of from about 1.0% to about 4.0% by weight, although the skilled artisan may use more or less as desired.

A plasticizer may also be included in the composition of this invention to prevent coating brittleness and to keep the composition pliable if desired. Suitable plasticizers include dibutylphthalate, triarylphosphate and substituted analogs thereof and, preferably, dioctylphthalate. The plasticizer is preferably present in the composition of this invention in an amount of from about 0.5% to about 1.25% by weight, although the skilled artisan may use more or less as desired.

Colorants useful herein include dyes such as Rhodamine, Calcozine, Victoria Blue and methyl violet, and such pigments as the anthraquinone and phthalocyanine types. Generally, the colorant is present in the form of a pigment dispersion which may comprise a mixture of one or more pigments and/or one or more dyes dispersed in a suitable solvent or mixture of solvents. When a colorant is used, it is preferably present in the composition of this invention in an amount of from about 1.5% to about 4.0% by weight, more preferably from about 1.75% to about 3.0% and most preferably from about 2.0% to about 2.75%, although the skilled artisan may use more or less as desired.

In order to form a coating composition for the production of photographic elements, the composition of this invention may be dissolved in admixture in a solvent or mixture of solvents to facilitate application of the composition to the substrate. Suitable solvents for this purpose include water, tetrahydrofuran, butyrolactone, glycol ethers such as propylene glycol monomethyl ether and methyl Cellosolve, alcohols such as ethanol and n-propanol, and ketones such as methyl ethyl ketone, or mixtures thereof. Preferably, the solvent comprises a mixture of tetrahydrofuran, propylene glycol, monomethyl ether and butyrolactone. In general, the solvent system is evaporated from the coating composition once it is applied to an appropriate substrate, however, some insignificant amount of solvent may remain as residue.

Substrates useful for coating with the composition of this invention to form a photographic element such as a color proofing film, photoresist or lithographic printing plate include sheets of transparent films such as polyester, aluminum and its alloys and other metals, silicon and similar materials which are well known in the art. Preferably, the substrate comprises aluminum. The substrate may first be pretreated by standard graining and/or etching and/or anodizing techniques as are well known in the art, and also may or may not have been treated with a composition such as polyvinyl phosphonic acid, sodium silicate or the like suitable for use as a hydrophilizing agent.

In the production of photographic elements such as lithographic printing plates, an aluminum substrate is first preferably grained by art recognized methods such as by means of a wire brush, a slurry of particulates or by chemical or electrochemical means, for example in an electolyte solution comprising hydrochloric acid. The grained plate is preferably then anodized for example in sulfuric or phosphoric acid in a manner well known in the art. The grained and optionally anodized surface is preferably then rendered hydrophilic by treatment with polyvinyl phosphonic acid by means which are also known to the skilled artisan. The thusly prepared plate is then coated with the base composition of the present invention, preferably at a coating weight of from about 0.6g/m$^2$ to about 2.5 g/m$^2$, more preferably from about 0.8 g/m$^2$ to about 2.0 g/m$^2$ and most preferably from about 1.2 g/m$^2$ to about 1.5 g/m$^2$, although these coating weights are not critical to the practice of this invention, and dried.

Preferably the thusly prepared photographic element is exposed to actinic radiation through a negative test flat so as to yield a solid 6 on a 21 step Stouffer exposure wedge after development. The exposed plate is then developed with a suitable aqueous developer composition such as a developer which comprises an aqueous solution containing one or more of the following groups:

(a) a sodium, potassium or lithium salt of octyl, decyl or dodecyl monosulfate;
(b) a sodium, lithium, potassium or ammonium metasilicate salt; and
(c) a lithium, potassium, sodium or ammonium borate salt; and
(d) an aliphatic dicarboxylic acid, or sodium, potassium or ammonium salt thereof having from 2 to 6 carbon atoms; and
(e) mono, di-, or tri-sodium or -potassium phosphate.

Other suitable developers include water, benzoic acid or sodium, lithium and potassium benzoates and the hydroxy substituted analogs thereof as well as those developers described in U.S. Pat. No. 4,436,807.

The following examples are illustrative of the invention but it is understood that the invention is not limited thereto.

EXAMPLE I

The following stock solutions are prepared by slowly adding the solution solids (binder, initiator, photomonomer and surfactant) in any order and under moderate stirring, to the solvent composition.

| | | |
|---|---|---|
| (1) Dowanol PM (propylene glycol monomethyl ether available from Dow Chemicals) | | 350.0 gm |
| (2) Methyl ethyl ketone | | 300.0 gm |
| (3) Butyrolactone | | 50.0 gm |
| (4) ByK 301 solution (1% modified silicon resin surfactant from Malinckrodt in Dowanol PM) | | 20.0 gm |
| (5) poly butane diol diacrylate having average molecular weight of 700–800 | | 50.0 gm |
| (6) 9 phenyl acridine photoinitiator | | 10.0 gm |
| (7) poly methyl methacrylate/methacrylic acid 95/5 | | 50.0 gm |
| (8) Mowilith 20 (polyvinyl acetate resin from Hoechst AG, average molecular weight 20,000) | | 20.0 gm |

100 gms. of this solution is then added to the indicated dispersion color, under moderate stirring, to achieve the appropriate coating color:

| | Stock Solution | Dispersion | Dispersion Composition |
|---|---|---|---|
| (1) | 100.0 gm | 10.0 gm Cyan | 10% Phthalocyanine Blue 26.3% PMMA/MA (85/15)* 63.7% methyl ethyl ketone (M.E.K.) solvent |
| (2) | 100.0 gm | 25.0 gm Yellow | 5% Diarylide yellow 26.3% PMMA/MA (85/15)* 66.7% M.E.K. solvent |
| (3) | 100.0 gm | 20.0 gm Red | 7% Rhodamine Red 26.3% PMMA/MA (85/15)* 66/7% M.E.K. Solvent |

*polymethyl methacrylate/methacrylic acid copolymer from Esschem Co.

Each of these coating solutions is whirler coated onto a polyethylene coated paper sheet (1.5 mils LD polyethene on 4.5 mil paper) and dried for 2 minutes at 80°. The dry coating weight can have a range of 0.5–5.0 gm/m² but 2.5–3.5 gm/m² is preferred.

The yellow coating is transferred to an adhesive treated (Mowilith 20-polyvinyl acetate adhesive applied from solvent at a coating weight of 5–20.0 gm/m²; preferred 8–12 gm/m²) white polyester sheet (Melinex 329) by mating the two sheets (adhesive promoter/coating) and running the composite through a 2-roll hot laminator whose preferred parameters are speed 26"/min.; temp. 150–170° F., pressure - moderate, contact time @1 sec.

The temporary carrier is then stripped away.

The transferred coating is exposed through a negative for 20 units in a Berkey Ascor exposure unit using a photopolymer bulb. The image is developed, by hand, in a standard one minute development cycle using a developer having tri-sodium phosphate 2.5%, mono sodium phosphate 0.5%, Niaproof anionic surfactant 8.5% and water 88.5%. The image cleared easily in the standard 1 minute development cycle and a sensitivity of solid 7 on the Stouffer scale was obtained.

The other colors were transferred in sequence (no additional adhesive needed) and exposed and developed in a similar manner:

| | Sensitivity |
|---|---|
| Cyan coating | Solid 8 |
| Magenta coating | Solid 8 |

(A polyvinyl alcohol oxygen barrier was not used for these exposures.)

EXAMPLE II

It is most unusual to find a photomonomer whose free-radical polymerization (begin by U.V. light acting on special initiators formulated with the photomonomer) will proceed extremely well without an oxygen barrier coating. A cross section group of photomonomers were put into the following formulation to determine how active these monomers were in the presence of oxygen.

| Component | Wt. % |
|---|---|
| Dowanol PM | 37.0 |
| Methyl ethyl ketone | 32.0 |
| Butyrolactone | 5.0 |
| ByK solution* | 2.0 |
| Varied photomonomers (see table) | 6.0 |
| 9 phenyl acridine | 1.0 |
| Methyl methacrylate/metharylic acid (95/5) | 5.0 |
| Mowilith 20 | 2.0 |
| Cyan pigment dispersion | 10.0 |
| Solids | 18.5 |

*1% ByK 301 in Dowanol PM

These solutions are whirler coated on three different substrates to similar color densities.

(A) Coated on temporary polyethylene (polyethylene coated polyester film) film base; transferred, by laminator, to permanent Melinex 329 film base (Melinex 329 previously coated with 8.0 gm/m² of Mowilith 20. Exposed through a negative for 20 BA units and developed with the developer of Example I. (This procedure represents use in the simplified color proofing system.)

(B) Coated on Melinex 516 and exposed and developed as in A.

(C) Coated on Melinex 516 overcoated with polyvinyl alcohol polymer (Gelvatol 20/30) and exposed and developed as in A.

The sensitivity findings are as follows:

TABLE I

| Monomer | A | B | C |
| --- | --- | --- | --- |
| (1) Poly butane diol diacrylate (an oligomer - 700–800 MW) | Clear 8 | Clear 7 | Clear 8 |
| (2) Tri methylol propane tri acrylate | Did not clean out | Clear 10 Very ghostly | Clear 14 |
| (3) Poly propylene glycol di acrylate | Clear 9 | Clear 11 | Clear 15 |
| (4) Poly propylene glycol di methacrylate 420 | Did not clean out | Clear 10 | Clear 14 |
| (5) Photomer 3005 Diamond Alkali Soya epoxy acrylate | Did not clean out and cracked | | |
| (6) Photomer 3082 - Diamond Alkali linseed epoxy acrylate | Did not clean out and cracked | | |

From the above it is evident that the molecular structure and the molecular weight of the photomonomer are important in ensuring that the material will stay in place (will not evaporate or solubilize too readily in the developer and will not be so high in molecular weight as to crack prevent clean out or crack.

It is further evident that the poly butane diol diacrylate monomer does resist attack by oxygen during polymerization, because the sensitivity is virtually the same (given the latitude of hand development) with or without the polyvinyl alcohol overcoat. Being able to eliminate the need for an oxygen barrier/release coat in this color proofing system greatly simplifies the manufacture of this product. Each color coat is applied to its temporary receiver sheet (polyethylene coated polyester base) and in this sense is not any more difficult to manufacture than diazo based overlay systems.

The adhesive coated permanent receiver sheet is also a single coating and, as such, is also easy to manufacture.

The simplicity of the use of the color proofing system by the customer lies in the fact that the color coat releases so easily from the temporary base. This means that moderate conditions of temperature and pressure in the laminator can be used to effect the transfer (a less expensive laminator can be used).

A further useful option is the use of a matte finished polyethylene on the temporary receiver sheet. Careful selection of this finish to match the surface texture of the printed sheet produces more realistic practical proofs.

What is claimed is:

1. A radiation-polymerizable composition which consists essentially of in admixture:
   (a) a polymerizable component which consists essentially of polybutane diol diacrylate having a molecular weight of from about 700 to about 800; and
   (b) a photoinitiator; and
   (c) an aqueous alkaline soluble binding resin; wherein said binding resin is present in an amount of from about 18.0% to about 40.0% based on the weight of the solids in the composition; and wherein said photoinitiator is present in an amount of from about 2.0% to about 10.0% based on the weight of the solids in the composition; and wherein said polymerizable component is present in an amount of from about 18.0% to about 40.0% based on the weight of the solids in the composition.

2. The composition of claim 1 wherein said photoinitiator comprises one or more compounds selected from the group consisting of p-methoxy quinoxaline, 9-phenyl acridine, poly ketaldonyl compounds, alphacarbonyl containing compounds, acyloin ethers, triarylimidazolyl dimer/p-amino-phenyl ketones and dye sensitized photolyzable organic halogen compounds.

3. The composition of claim 1 wherein said binding resin comprises one or more compounds selected from the group consisting of styrene/maleic anhydride polymers having monomer content at a ratio of from 70/30 to about 95/5; polymethyl methacrylate/methacrylic acid copolymer having a ratio of monomers ranging from about 70/30 to 95/5; polymethyl methacrylate/ethyl acrylate/methacrylic acid copolymers having a ratio of monomers ranging from about 50/30/20 to about 90/5/5; polymethyl methacrylate/butyl acrylate/methacrylic acid copolymer having a ratio of monomers ranging from about 50/30/20 to about 90/5/5, polyvinyl pyrrolidone polymers, hydroxypropyl cellulose, methyl cellulose and ethyl hydroxy ethyl cellulose polymers.

4. The composition of claim 1 wherein said binding resin comprises a compound having the general formula

wherein a plurality of each of components A, B and C occur in ordered or random sequence in the resin and wherein A is present in said resin at about 5% to about 20% by weight and comprises groups of the formula

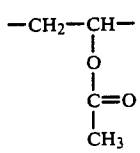

B is present in said resin at about 4% to about 30% by weight and comprises groups of the formula

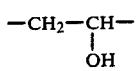

and C is present in said resin at about 50% to about 91% by weight and comprises acetal groups consisting of groups of the formulae

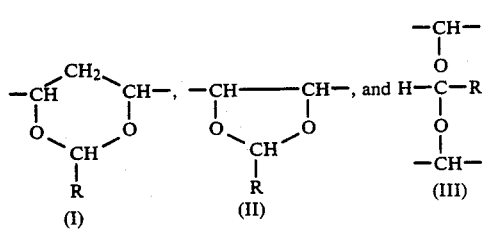

where R is lower alkyl or hydrogen, and wherein said group I is present in component C from about 75% to about 85%, group II is present in component C from about 3% to about 5%, and group III is present in component C from about 10% to about 22%, wherein said groups I, II and III are based on the number of acetal groups in component C.

5. The composition of claim 1 further comprising one or more additional components selected from the group consisting of solvents, acid stabilizers, exposure indicators, plasticizers, photoactivators and colorants.

6. A photographic element which comprises the composition of claim 1 disposed on a substrate.

7. A photographic element which comprises the composition of claim 3 disposed on a substrate.

8. A photographic element which comprises the composition of claim 4 disposed on a substrate.

9. The element of claim 6 wherein said substrate comprises one or more components selected from the group consisting of transparent films, polymeric materials, metals, silicon and semiconductor materials.

10. The element of claim 6 wherein said substrate comprises polyethylene terephthalate.

11. The element of claim 6 wherein said substrate comprises aluminum.

12. The element of claim 11 wherein said aluminum substrate has had its surface treated with one or more processes selected from the group consisting of anodizing, graining and hydrophilizing.

13. The composition of claim 5 wherein said additional components are present in a minor amount.

14. The radiation-polymerizable composition of claim 1, further comprising a solvent selected from the group consisting of water, tetrahydrofuran, butyrolactone, glycol ethers, alcohols, ketones and mixtures thereof.

15. A photographic element which comprises a substrate and a dried radiation-polymerizable composition on the substrate, in the absence of an oxygen barrier layer on the dried radiation-polymerizable composition, wherein the radiation-polymerizable composition consists essentially of in admixture;
(a) a polymerizable component which consists essentially of polybutane diol diacrylate having a molecular weight of from about 700 to about 800; and
(b) a photoinitiator; and
(c) an aqueous alkaline soluble binding resin;
wherein said binding resin is present in an amount of from about 18.0% to about 40.0% based on the weight of the solids in the composition; and wherein said photoinitiator is present in an amount of from about 2.0% to about 10.0% based on the weight of the solids in the composition; and wherein said polymerizable component is present in an amount of from about 18.0% to about 40.0% based on the weight of the solids in the composition.

16. The photographic element of claim 15 wherein said photoinitiator comprises one or more compounds elected from the group consisting of p-methoxy-quinoxaline, 9-phenylacridine, poly ketaldonyl compounds, alpha-carbon containing compounds, acyloin ethers, triarylimidazolyl dimer/p-amino-phenyl ketones and dye sensitized photolyzable organic halogen compounds.

17. The photographic element of claim 15 wherein said binding resin comprises one or more compounds selected from the group consisting of styrene/maleic anhydride polymers having monomer content at a ratio of from 70/30 to about 95/5; polymethylmethacrylate/methacrylic acid copolymers having a ratio of monomers ranging from about 70/30 to 95/5; polymethylmethacrylate/ethyl acrylate/methacrylic acid copolymer having a ratio of monomers ranging from about 50/30/20 to about 90/5/5; polymethylmethacrylate/butyl acrylate/methacrylic acid copolymer having a ratio of monomers ranging from about 50/30/20 to about 90/5/5, polyvinyl pyrrolidone polymers, hydroxypropyl cellulose, methyl cellulose and ethyl hydroxy ethyl cellulose polymers.

18. The photographic element of claim 15 wherein said binding resin comprises a compound having the general formula

—A—B—C— wherein a plurality of each of components A, B and C occur in ordered or random sequence in the resin and wherein A is present in said resin at about 5% to about 20% by weight and comprises groups of the formula $$-CH_2-CH- \\ | \\ O \\ | \\ C=O \\ | \\ CH_3$$

B is present in said resin about 4% to about 30% by weight and comprises groups of the formula $$-CH_2-CH- \\ | \\ OH$$

and C is present in said resin at about 50% to about 91% by weight and comprises acetal groups consisting of groups of the formulae (I), (II), and (III)

where R is lower alkyl or hydrogen, and wherein said group I is present in component C from about 75% to about 85%, group II is present in component C from about 3% to about 5%, and group III is present in component C from about 10% to about 22%, wherein said groups I, II, and III are based on the number of acetal groups in component C.

19. The photographic element of claim 15 wherein said composition further comprises one or more additional components selected from the group consisting of solvents, acid stabilizers, exposure indicators, plasticizers, photoactivators and colorants.

20. The photographic element of claim 19 wherein said one or more additional components are present in the composition in a minor amount.

21. The photographic element of claim 15 wherein said substrate comprises one or more components selected from the group consisting of transparent films, polymeric materials, metals, silicon and semiconductor materials.

22. The photographic element of claim 15 wherein said substrate comprises polyethylene terephthalate or aluminum.

23. The photographic element of claim 15 wherein said substrate comprises aluminum whose surface has been treated with one or more processes selected from the group consisting of anodizing, graining and hydrophilizing.

* * * * *